(12) United States Patent
Faxvog et al.

(10) Patent No.: US 11,451,044 B2
(45) Date of Patent: Sep. 20, 2022

(54) AUTOMATED SELF TESTING OF POWER GRID TRANSFORMER PROTECTION SYSTEMS

(71) Applicant: TechHold, LLC, Minneapolis, MN (US)

(72) Inventors: Frederick R. Faxvog, Medina, MN (US); Greg Fuchs, River Falls, WI (US); Wallace Jensen, Centerville, MN (US); David Anderson, Excelsior, MN (US)

(73) Assignee: TechHold, LLC, Minneapolis, MN (US)

( * ) Notice: Subject to any disclaimer, the term of this patent is extended or adjusted under 35 U.S.C. 154(b) by 40 days.

(21) Appl. No.: 17/102,039

(22) Filed: Nov. 23, 2020

(65) Prior Publication Data
US 2021/0159689 A1   May 27, 2021

Related U.S. Application Data

(60) Provisional application No. 62/939,411, filed on Nov. 22, 2019.

(51) Int. Cl.
| | | |
|---|---|---|
| *H02H 3/05* | (2006.01) | |
| *G01R 31/333* | (2006.01) | |
| *H02H 3/20* | (2006.01) | |
| *H02H 1/00* | (2006.01) | |

(52) U.S. Cl.
CPC ........... *H02H 3/05* (2013.01); *G01R 31/3333* (2013.01); *H02H 1/0007* (2013.01); *H02H 3/20* (2013.01)

(58) Field of Classification Search
CPC .... G01R 31/333; G01R 31/3333; H02H 5/00; H02H 5/005; H02H 7/04; H02H 1/0007; H02H 1/0015; H02H 1/003; H02H 3/044; H02H 3/05; H02H 3/17; H02H 3/20; H02H 3/202; H02H 3/205; H02H 3/22
See application file for complete search history.

(56) References Cited

U.S. PATENT DOCUMENTS

| | | |
|---|---|---|
| 8,537,508 B2 | 9/2013 | Faxvog et al. |
| 8,878,396 B2 | 11/2014 | Faxvog et al. |
| 9,564,753 B2 | 2/2017 | Faxvog et al. |
| 9,660,441 B2 | 5/2017 | Fuchs et al. |

(Continued)

OTHER PUBLICATIONS

Faxvog, "HV Power Transformer Neutral Blocking Device (NBD)" Retrieved from Internet:https://static1.squarespace.com/static/57bc8a4a414fb50147550a88/t/59fb4629084665d0199f607d/1509639730091/2017+11+07++HV+Power+Transformer+Neutral+Blocking+Device+%28NBD%29+Operating+Ex (Year: 2017).*

*Primary Examiner* — Jared Fureman
*Assistant Examiner* — Nicolas Bellido
(74) *Attorney, Agent, or Firm* — Merchant & Gould P.C.

(57) ABSTRACT

Systems and method for automated self-testing of a protective device for a transformer are disclosed. One system includes a protection circuit electrically connected to a transformer neutral, the transformer electrically connected to a power grid, the protection circuit may include a DC blocking component, a switch assembly, and a spark gap assembly each positioned in parallel between the transformer neutral and ground, a switch assembly. The system may further include various testing circuits configured within the protection circuit and switches which when actuated inject a signal to test various components in the protective device.

22 Claims, 14 Drawing Sheets

(56) References Cited

U.S. PATENT DOCUMENTS

| | | | |
|---|---|---|---|
| 10,199,821 B2* | 2/2019 | Fuchs | H02H 7/04 |
| 2013/0308229 A1* | 11/2013 | Faxvog | H02H 7/04 |
| | | | 361/35 |
| 2015/0311697 A1* | 10/2015 | Faxvog | H02H 7/04 |
| | | | 361/35 |
| 2016/0197469 A1* | 7/2016 | Fuchs | H02H 5/005 |
| | | | 361/35 |

\* cited by examiner

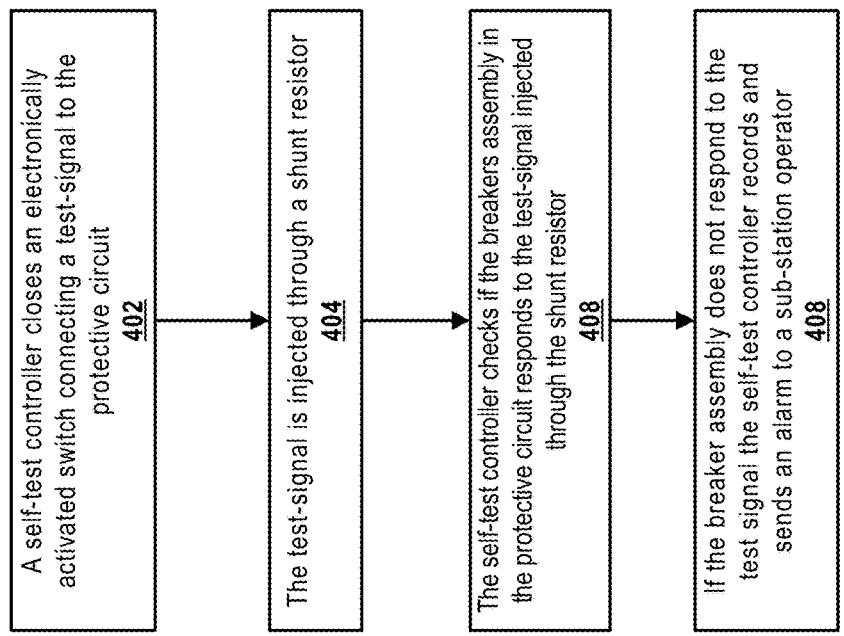

AUTOMATED SELF TESTING OF POWER GRID TRANSFORMER PROTECTION SYSTEMS

CROSS REFERENCE TO RELATED APPLICATIONS

This application claims priority from U.S. Provisional Patent Application Ser. No. 62/939,411, filed Nov. 22, 2019; which is hereby incorporated by reference in its entirety.

TECHNICAL FIELD

The present disclosure relates generally to an automated self-testing device of an electrical protection system for electrical equipment; in particular, the present disclosure relates to an automated self-testing device for a transformer neutral blocking circuit.

BACKGROUND

Electrical systems, and in particular high-voltage and high-power electrical systems, are subject to damage when substantial, unexpected electrical events occur. Particular examples of electrical systems and devices that are susceptible to damage include high-voltage transformers and associated relays that are installed in the power grid. Protection system or devices have been developed, tested and used in power grids in several cases. In some situations, the periodic testing of such protection systems might only occur infrequently. For example there could be a period of many months or even several years when few solar storms impact the earth. This can happen during the minima of the roughly eleven year solar sunspot cycle. During such low solar activity periods the high voltage (HV) power transformer protection system described in this invention might not be activated by a solar geomagnetic disturbance (GMD) for many months. The intent of this invention is to provide an automatic periodic test by injecting either current or voltage signals, into the protection system to exercise the HV transformer protection system and verify that it is on-line and is operating as designed.

Electrical equipment is subject to varying input signals and conditions. In typical arrangements, alternating current devices expect to receive a 60 Hz power line source (or 50 Hz in Europe) having a predetermined magnitude (i.e., 120 Volts in North America or 240 Volts in Europe). Although these power sources may vary somewhat, devices made for use with a particular current can typically handle some slight variation in the power signal received.

In some cases, a power signal can vary widely due to external conditions or unwanted harmonics superimposed on the fundamental (60 Hz) power signal. External conditions that may cause harmonics or quasi-direct currents (DC) on a power signal include geomagnetic storms and potentially impact and/or degrade electrical power grid equipment. Such events can cause the input voltage and current (and resulting power) of a power signal to vary dramatically, causing a potential for damage to the electrical equipment receiving that power signal. Geomagnetic storms or the E3 pulse associated with a high altitude electromagnetic pulse (HEMP) can induce DC or quasi-DC currents called Geomagnetic Induced Currents (GIC) in high voltage power generation, transmission, and distribution system components, e.g. power transmission lines, power transformers and power generators. These DC currents can cause half cycle saturation in power transformer cores which in turn can result in excessive reactive power losses, heating, damage and/or failure of such a transformer, particularly in older transformers. In addition, the half cycle saturation can cause the generation of harmonics of the primary frequency (50 or 60 Hz). This harmonic content can cause power system relays to trigger, which can decouple required compensation components. This in turn can result in the collapse of local or wide area portions of a power grid.

Over approximately the last two decades, several suggested approaches for reducing GIC or HEMP (E3) induced DC currents in power systems have been proposed. These solutions generally take one of a few forms. The most effective and reliable solution uses a capacitive circuit to simultaneously provide an AC grounding path for a HV transformer and a blocked path for the induced DC currents.

Another solution uses a resistive approach in which fixed value resistors are used to continuously reduce the DC current in the neutral to ground connection of a transformer; however these resistors typically have a high resistance value and will only reduce, not eliminate the DC or quasi DC neutral current. Additionally, during the installation of this type of solution a readjustment of the power system's relay settings may be required.

Several suggested approaches for reducing or blocking GIC or E3 induced currents in power systems have been proposed. In recent years a patented approach that uses a sensing and control system that first senses the presence of GIC or E3 events which then switches a DC blocking device to protect high voltage transformers. This solution was designed, fabricated, tested extensively and placed into operation in the American Transmission Co. power grid in 2015. This HV transformer protection system is described in U.S. patents numbers U.S. Pat. No. 8,537,508 B2 and U.S. Pat. No. 8,878,396 B2. Since that time the system has automatically operated as expected a number of times for low level solar storms. During the periods of low solar activity, there is a long period (several years) for which the sun is relatively inactive and as a result few storms hit the Earth. In this case a power system operator may want to test the protection system in order to verify it is ready to provide automated GIC protection when a GMD or other potentially harmful electrical signals occur.

For these and other reasons, improvements are desirable.

SUMMARY

In accordance with the following disclosure, the above and other issues are addressed by the following:

In a first aspect, a self-testing system for use within an electrical protection circuit is disclosed. The system includes the electrical protection circuit electrically connected between a neutral of a transformer and a ground, the transformer electrically connected to a power grid, wherein the electrical protection circuit includes a switch assembly. The switch assembly includes a plurality of switches connected in series with a shunt resistor between the neutral and the ground, the shunt resistor being electrically connected adjacent the ground. The system further includes a switch assembly test circuit. The switch assembly test circuit includes a switch-testing voltage source in series with a current limiting resistor, and a test actuation switch electrically connected between the switch-testing voltage source, and a location between the shunt resistor and the switch assembly. In one embodiment when the test actuation switch is closed, a test current is applied across the shunt resistor to test whether the switch assembly is actuated in response to a detected current flowing through the shunt resistor exceeding a predetermined threshold representative of potential damage to one of the transformer or the DC blocking circuit.

In a second aspect, a self-testing system for use with within an electrical protection circuit is disclosed. The system includes the electrical protection circuit electrically connected between a neutral of a transformer and a ground, the transformer electrically connected to a power grid, wherein the electrical protection circuit includes a DC blocking component. The system further includes a source electrically connected in parallel with the DC blocking component, the source including a voltage source, a current measurement device configured to determine a current flowing through the DC blocking component, and a voltage measurement device configured to determine a voltage across the DC blocking component. Additionally, the system includes a switch electrically connected between the test voltage source and the DC blocking component. The self-test system has a testing mode in which the switch is closed to introduce a test voltage across the DC blocking component, and where an impedance of the DC blocking component is measured and compared to an expected design value in the testing mode.

In a third aspect, a self-testing system for use within an electrical protection circuit is disclosed. The self-system includes an electrical protection circuit electrically connected between a neutral of a transformer and a ground, the transformer electrically connected to a power grid. The system also includes a first switch electrically connected between the transformer neutral and the spark gap assembly. The electrical protection circuit includes a spark gap assembly, a high voltage source, and a second switch. The high voltage source and the switch are electrically connected in series with each other and in parallel with the spark gap assembly. When the second switch is closed, a test high voltage is injected across the spark gap assembly to determine a breakdown voltage of the spark gap assembly.

In a still further aspect, a method for testing an electrical protection circuit electrically connected to a transformer is disclosed. The method includes closing a switch connecting a test circuit to a DC blocking component, generating a voltage across the DC blocking component, measuring an impedance of the DC blocking component, and comparing the impedance measured to an expected design value of the DC blocking component.

BRIEF DESCRIPTION OF THE DRAWINGS

FIG. 5 is a process flow diagram illustrating an example method for self-testing a neutral blocking protective system.

DETAILED DESCRIPTION

Figure 1:
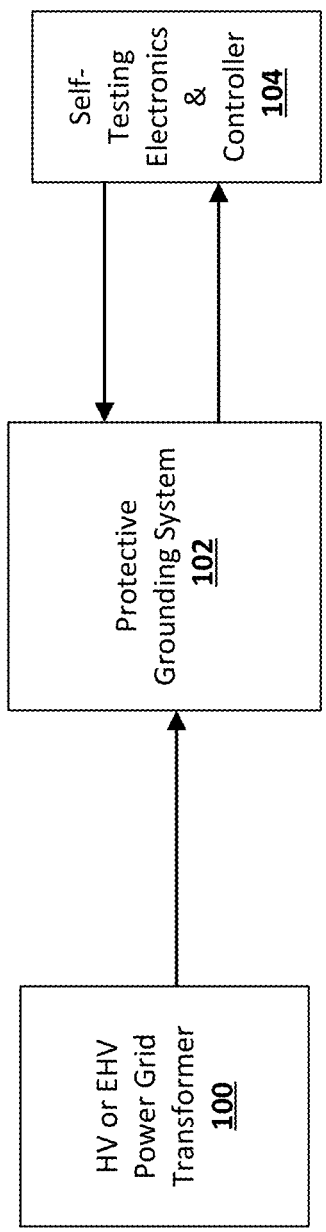
FIG. 1 is a block diagram of self-testing system for HV & EHV power transformer protective systems.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, the present disclosure describes systems and methods for testing protective systems that rely on electrical and/or electronic equipment that is used for protecting power utility transformers and other electrical or electromechanical equipment from DC currents and their negative impacts to AC power systems. In some examples, the present disclosure is directed to a series of automated tests that will provide the power grid operator information regarding whether the GIC blocker is available to operate as needed. These tests may be initiated locally or from a remote system, depending on the needs of the particular electrical system operator.

Overall, the present disclosure describes methods and systems for periodically self-testing an electrical system designed to react to external events that can be very infrequent, with no events occurring for a number of months or longer. The self-testing device is comprised of several electrical voltage and current sources which inject electrical currents or voltages into an electrical protective system which is used to protect large high voltage (HV) and extra high voltage (EHV) power transformers from potentially damaging geomagnetic induced currents that are caused by solar geomagnetic storms or by an electromagnetic pulse created by a nuclear explosive device. The testing may occur automatically, or may be initiated from a remote device, such as a supervisory control and data acquisition (SCADA) system.

The self-testing device disclosed herein provides a testing scheme that is compatible with the electrical system being tested and hence will not require any changes to the power system relay settings. Such a self-testing function provides a layer of reliability that ensures that an important function of a system will in fact operate and be available if a damaging event or condition should occur. Such potentially damaging events may occur infrequently, for example only once a month or only once in several years in an extreme case. Such a self-testing device becomes valuable if it ensures, for power system operators, that power grid protective equipment will operate as expected.

FIG. 1 is a generalized embodiment of a self-testing electronics & controller 104 that periodically injects a voltage and/or current signal into the protective grounding system 102, of a HV or EHV Power Grid Transformer 100, to determine if the protective system operates as expected. In the embodiment shown, a HV or EHV power Grid Transformer 100, is electrically connected to a protective grounding system 102. A self-testing electronics and controller 104 is also electrically connected to the protective grounding system 102. The self-testing electronics and controller 104 can, for example, include at least a portion of the devices described below, according to the embodiments shown in FIGS. 2-4B, 6A-B, and 9A-B. The protective grounding system 102 can, for example, include at least a portion of the devices described below, according to the embodiments shown in FIGS. 3-4B, 6A-B, and 9A-B. A computer or stand-alone electronic controller is programmed to periodically initiate this self-test to ensure that the protective grounding system 102 is working as expected and will operate when an external event occurs. A computer or stand-alone electronic controller may be either local to or remote from the self-testing electronics and controller 104, to initiate such tests and receive reports of results of such tests.

In example implementations, a test sequence consists of first sending a signal to the utility power system operators that communicates that a self-test procedure is now being conducted. An initial voltage and/or current from the self-testing electronics and controller 104 is applied to the protective system.

Figure 2:
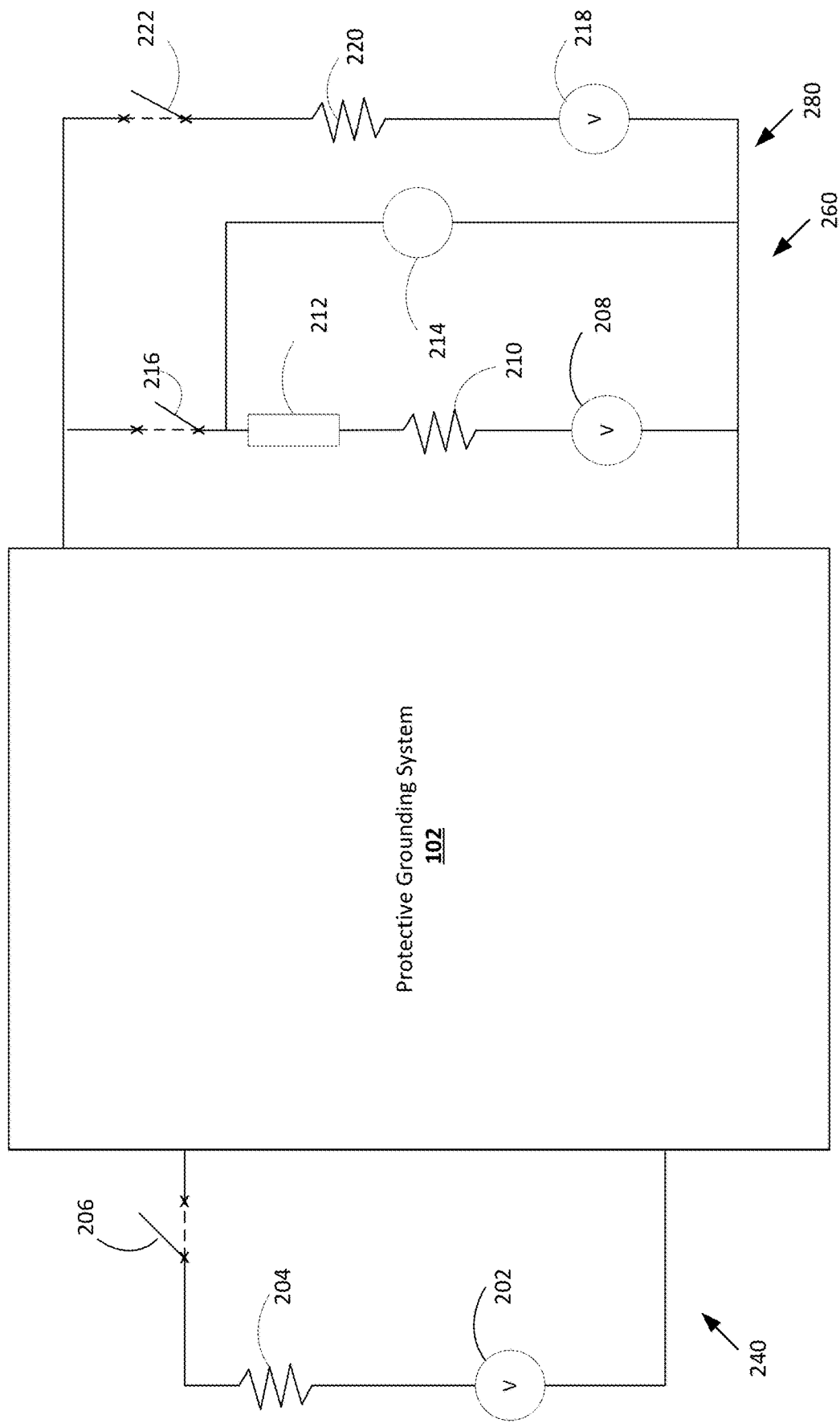
FIG. 2 is a circuit diagram of the self-testing electronics.

FIG. 2 shows one example of self-testing electronic circuits of the self-testing electronics & controller 104 connected to the protective grounding system 102. In the example shown, the self-testing circuits include a first test circuit 240, a second test circuit 260, and a third test circuit 280. Each of the test circuits may be individually included with various types of electrical protection circuits; a specific relationship between the test circuits and electrical protection circuit components to be tested is provided below in connection with FIG. 3.

In the embodiment shown, the first test circuit 240 includes a first voltage source 202 in series with a resistor 204. An electronic switch 206 is also connected in series with the first voltage source 202 and resistor 204, and may be used to selectively connect the circuit to the protective grounding system 102. The electronic switch 206 is operated by a controller such as controller 104 of FIG. 1, to initiate a self-testing procedure.

In example embodiments, the first test circuit 240 may be used to simulate any geomagnetic induced current. For example, the first voltage source 202 and resistor 204 may have voltage and resistance values selected such that, when electronic switch 206 is closed, a current may be generated which is sufficient to be detected at the protective grounding system 102 as a geomagnetically induced current. For example, a voltage of 1-300 volts may be used as voltage source 202, with resistor 204 having a resistance typically in a range of 0.1 to 24 Ohms. As will be discussed below, a change in operation of the protective grounding system 102 may be detected, e.g., either at controller 104 or other control/monitoring system, to determine whether such a simulated geomagnetically induced current event is detected and responded to.

FIG. 2 also shows a second test circuit 260 which, in the embodiment shown, includes a voltage source 208 in series with a resistor 210 and a current measurement component 212, all in parallel with a voltage measurement component 214. The second circuit is operably connected to the protective grounding system by an electronic switch 216. The electronic switch 216 is operated by a controller (e.g., controller 104 of FIG. 1) to initiate a self-testing procedure. The voltage measurement component 214 and the current measurement component 212 are arranged to measure voltage across and current flowing through a DC blocking component in the protective grounding system 102. These measured values may be used to measure impedance of a DC blocking component in the protective grounding system 102. In some embodiments the voltage measurement component 214 and current measurement component 212 are arranged to measure values for calculating the resistance and/or capacitance of one or components in the protective grounding system. In example embodiments, the voltage source 208 may be an alternating current (AC) voltage source of about 5 volts to 300 volts, preferably at a frequency other than a power line frequency. The resistor 210 may have a resistance of about 0.2 to 2,000 Ohms. The current measurement component 212 may also be a resistor; in example embodiments, the current measurement component 212 is a precision resistor having a predetermined resistance value between about 0.2 to 2,000 Ohms, inclusive. The voltage measurement component 214 may, in various embodiments, be implemented as a voltage probe.

In the example shown, a third test circuit 280 is also shown which includes a voltage source 218 in series with a resistor 220 and an electronic switch 222. The electronic switch 222 is operated by a controller (e.g., controller 104 of FIG. 1) to initiate a self-testing procedure. In some embodiments each of the voltage sources 202, 208, 218 may be an AC Voltage Source or a DC Voltage source. Alternatively, each of the voltage sources 202, 208, 218 may be replaced with a current source. In the embodiment shown the voltage source is a high voltage source which may charge the protective grounding system to between 200 V and 20 kV. The voltage source 218 may be an AC voltage source or a DC voltage source. The resistor 220 acts as a current limiter, and is selected to control current that may occur during a test. In example implementations, depending on the selected self-test source voltage, the resistor may have a resistance value of between 20 Ohms and 2 MOhms.

Some embodiments may include all of the testing circuits, a single testing circuit, or any other combination of the testing circuits discussed above. Additionally, the electronic switches 206, 216, and 222 can be any variety of fast acting electrically controlled switches, such as a high voltage circuit breaker switch. In the embodiments shown switches 206, 216 and 222 are normally open connection which may be closed to activate a test stimulus, as discussed in more detail below.

Figure 3:
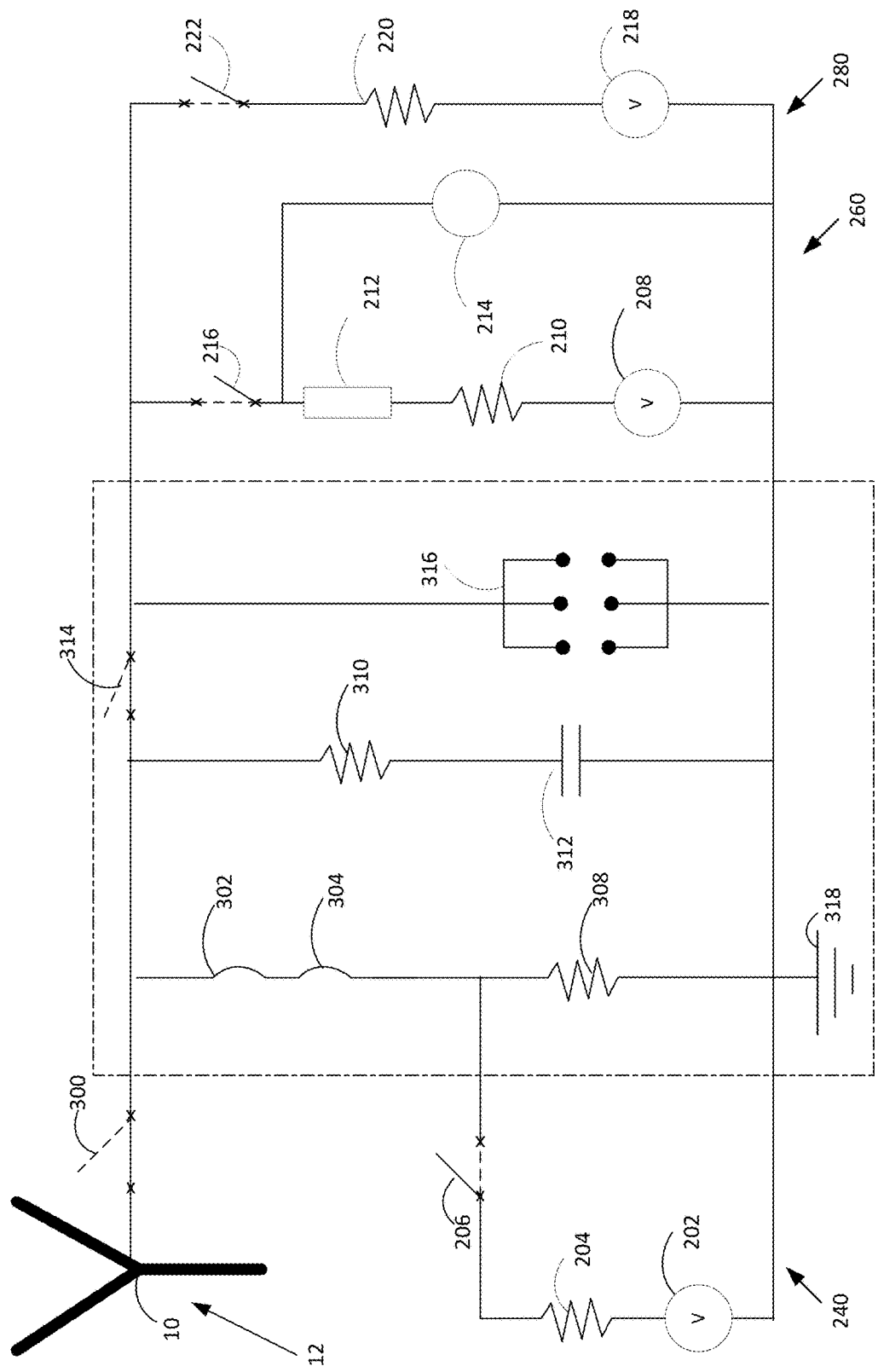
FIG. 3 is a circuit diagram of the self-testing electronics connected to a HV & EHV power transformer protective system.

FIG. 3 shows the different components of a protective grounding system 102, connected to the self-testing electronic circuits of FIG. 2, according to an example embodiment. The protective grounding system is generally connected between a transformer neutral 10 of a transformer 12 (seen as Y-transformer in the embodiment shown) and ground 318. The connection between the transformer neutral 10 and the protective grounding system 102 may include an automated motorized or manual grounding switch 300 (sometimes referred to as a trapped-key interlock grounding switch) to disconnect the electrical protective circuit from the transformer neutral 10 connection of the transformer 12. As discussed in more detail below in some embodiments the switch 300 may be opened while testing an aspect of the protective grounding system, isolating the testing stimulus from the transformer neutral 10.

In the embodiment shown, the protective grounding system includes a parallel path between the transformer neutral 10 and ground 318 with a breaker assembly. The breaker assembly includes an AC breaker 302, DC breaker 304, and a shunt resistor 308 in series. In the embodiment shown, the AC breaker 302 and the DC breaker 304 are both in a closed position, grounding the transformer. In other embodiments the AC breaker is in an open position and the DC breaker 304 is in a closed position. One of or both of the AC breaker 302 and DC breaker 304 are configured to switch open in the event of a large DC current between the transformer 100 to ground 318. The shunt resistor 308 provides an interface across which sensing electronics can be connected and can be used to sense current passing from the transformer neutral 10 to ground 318. The shunt resistor 308 is connected to the first circuit discussed in FIG. 2, and below in FIGS. 4A-B, by the electronic switch 206, which allows the shunt resistor to sense current passing through the first testing circuit. In certain embodiments, the shunt resistor 308 would typically have a low resistance, on the order of a few milliohms, to allow for a low impedance ground connection through the breaker assembly. In another embodiment, the shunt resistor 308 could be replaced by a Hall Effect current sensor or other non-contact current sensor. The first test circuit described in figure two is arranged in order to inject a simulated geomagnetic induced current through the shunt resistor 308.

The protective grounding system shown further includes parallel path between the transformer neutral 10 and ground 318 with a DC blocking arrangement. The DC blocking arrangement includes a damping resistor 310 and a capacitor bank 312. The damping resistor 310 and the capacitor bank 312 are capable of some blocking of a current path between the transformer neutral 10 and ground 318, to prevent damaging DC or quasi DC ground currents in the transformer neutral 10 which would cause damage in the transformer 12. The capacitor bank 312 may be a single capacitor or a bank of multiple capacitors. To further increase the reliability the circuit may include a parallel bank of multiple capacitors or resistors such that if one or more of these capacitors or resistors fail the others would still be available as blocking components. The damping resistor 310, in some embodiments, corresponds to an approximately 1-ohm power resistor configured for large current applications, and useable to limit current occurring based on discharging from the capacitor bank 312. The capacitor bank 312 has, in the embodiment shown, a 4.8 kV charging capacity, and a one-ohm reactance, thereby allowing the capacitor bank 312 to provide quick reactivity to changes occurring in the circuit. The capacitor bank 312 and damping resistor 310 operate, in this configuration, with the second circuit discussed in FIG. 2, and below in FIGS. 6A-B, which is connected by the electronic switch 216.

In the example shown, the protective grounding system 102 may also include in a parallel path between the transformer neutral 10 and ground 318 a spark gap assembly 316. The spark gap assembly 316 may include a single spark gap or multiple spark gaps. In an example embodiment, the spark gap will fire at about 8 to 9 kV, although other thresholds could be used as well (for example, as low as about 4 kV and up to about 20-28 kV, depending on a voltage threshold rating of the associated transformer). Example operation and design of such a spark gap is described in U.S. Pat. No. 9,660,441 B2, the disclosure of which is hereby incorporated by reference in its entirety.

In the example shown, the spark gap assembly operates with the third circuit discussed in FIG. 2, and below in FIGS. 9A-B, which is connected by electronic switch 222. As discussed below, testing the spark gap assembly 316 in some instances may include inducing a large voltage. For example, a voltage may be used which is sufficiently high for a spark to form across the spark gap, e.g., above the threshold described above. However, a relatively low current may be used, on the order of a few milliamps. The protective grounding system may include an electronic switch 314, which may be opened to protect the connected transformer 12, the breaker system, and/or the capacitor bank, while inducing a high voltage to test the spark gap component.

In various embodiments, different types of electrical protection circuits could be used. In example embodiments, electrical protection circuits could include those described U.S. Pat. No. 8,537,508 B2, entitled "Sensing and Control Electronics for a Power Grid Protection System", and U.S. Pat. No. 8,878,396 B2, entitled "Continuous Uninterruptable AC Grounding System for Power System Protection", the disclosure of each are hereby incorporated by reference in their entirety. Still further example embodiments of electrical protection circuits could be as described in U.S. Pat. No. 9,564,753, the disclosure of which is also incorporated by reference in its entirety.

Figure 4A:
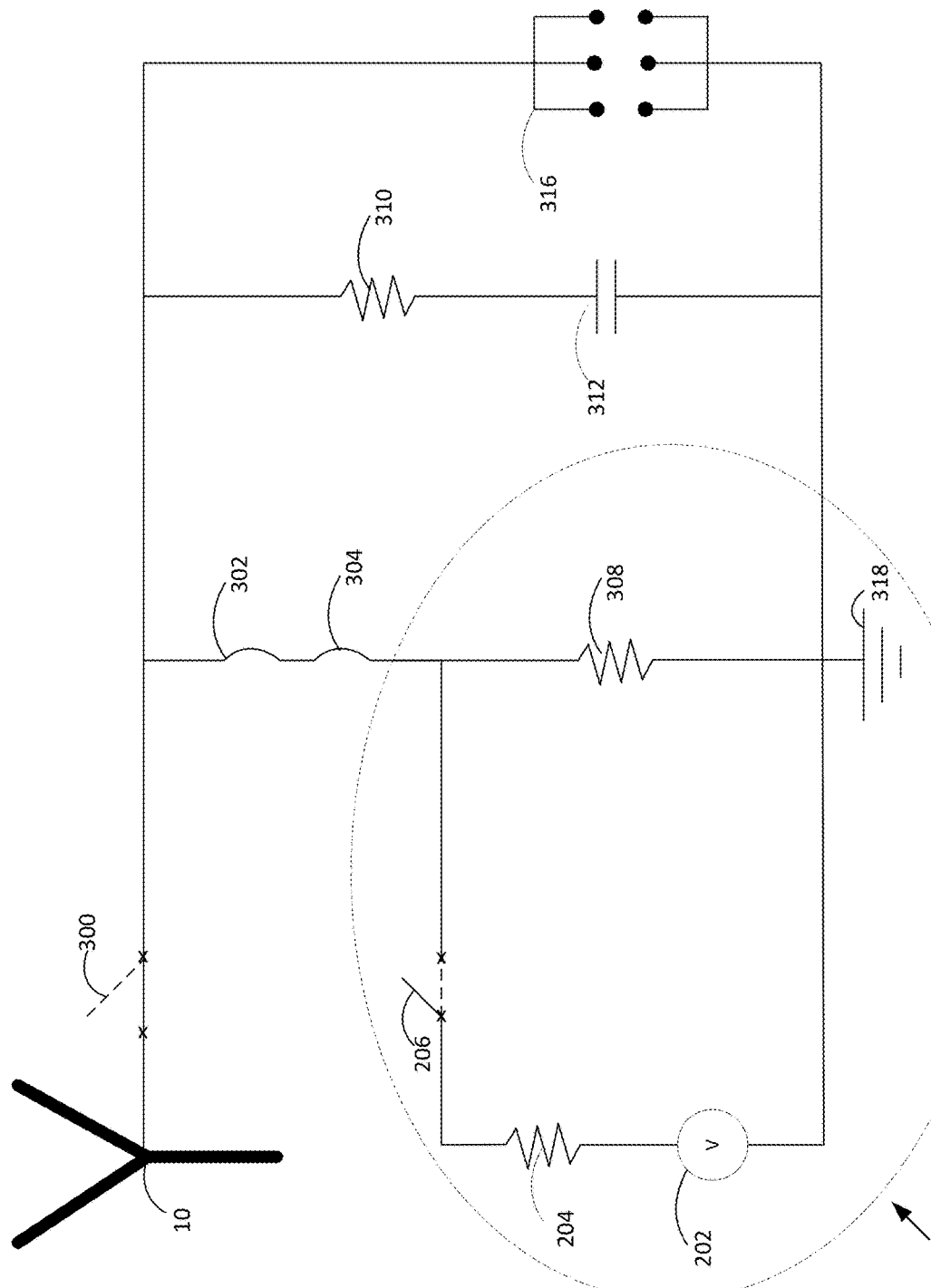
FIG. 4A is a circuit diagram that shows the testing circuit of the automatic operation of a neutral blocking protective system.

FIG. 4A shows in more detail the first self-testing circuit 240 connected to a neutral ground blocking system which is used in the neutral connection of an HV or EHV transformer for protection against unwanted geomagnetic currents (GICs) induced by either solar storms or an electro-magnetic pulse (EMP) generated by a nuclear explosive device. In the embodiment shown the automated motorized grounding switch 300 is in a closed position. In normal, non-testing, operation the electronic switch 206 is in the open position, and the self-test current is not connected to the shunt resistor 308. The shunt resistor typically has a resistance on the order of one milliohm. The AC breaker 302 is, in a default embodiment, in an open position, blocking DC from flowing through the neutral of the transformer. In the example shown, the DC breaker 304 is by default in a closed position. In another embodiment, both the AC breaker 302 and DC breaker 304 are in a default closed position.

Figure 4B:
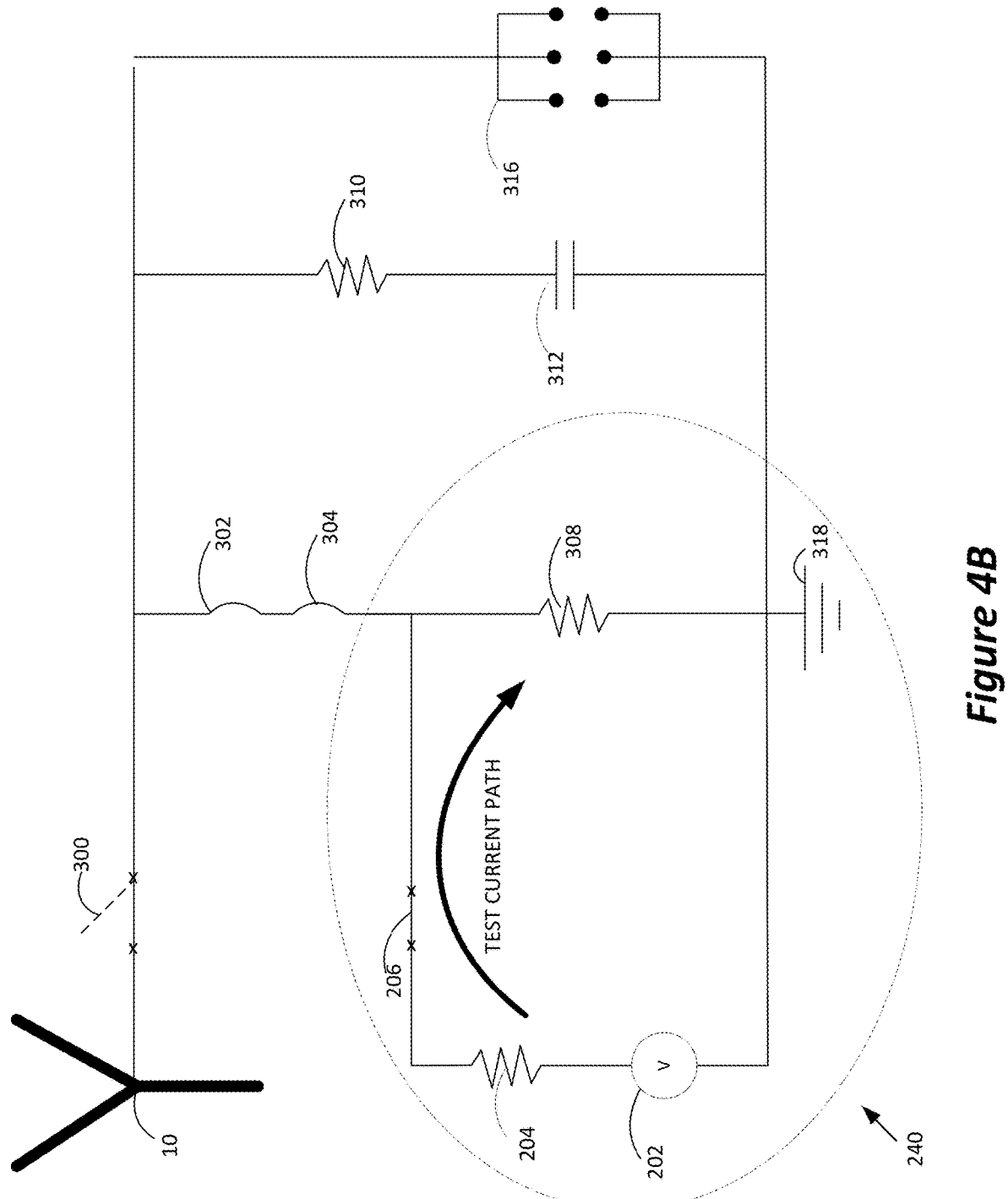
FIG. 4B is a circuit diagram that shows the testing circuit of the automatic operation of a neutral blocking protective system in its testing mode.

FIG. 4B shows a typical self-test injected DC current directed into the current sensing shunt resistor 308. The automated motorized grounding switch 300 may remain in a closed position during the self-test. To perform a self-test, the controller will close the electronic switch 206. The self-test current for testing the automatic operation of the protection system is provided to the shunt resistor 308, which produces a voltage signal that is detected by the system controller electronics. The system controller (e.g., controller 104 of FIG. 1) in turn triggers the breaker assembly in the neutral blocking system to operate such that the power transformer is then AC grounded by the damping resistor 310 and the capacitor bank 312. The capacitor bank in the neutral blocking system then blocks the quasi DC GIC or EMP-E3 current and simultaneously provides an effective AC ground for the power transformer.

Since the shunt resistor 308 has a low resistance, on the order of one milliohm (and typically in a range of about 0.001 to 3 Ohms), nearly all the injected test current will flow through the shunt resistor 308 and not into the transformer neutral 10 and grid, which has a much larger resistive path. As described in U.S. Pat. No. 8,537,508 B2 and U.S. Pat. No. 8,878,396 B2, the detection of the introduced DC current will cause the controller to trigger the breaker assembly to open, opening AC breaker 302 and DC breaker 304, thereby allowing the HV or EHV transformer to be AC grounded through the capacitor bank. In this mode of operation, the geomagnetic induced currents (GICs) or EMP-E3 quasi-DC currents are blocked which thereby protects the HV or EHV power transformer. In some embodiments only one of the AC breaker 302 or DC breaker 304 will open in response to a measured current above a threshold. In other embodiments one of the AC breaker 302 or DC breaker 304 will open before the other breaker opens. If the expected operation in response to the test, i.e., causing the controller to open one or both of the breakers, fails (for example the system does not go into its protection mode of operation), the system controller will initiate and send an alarm to the substation operator to indicate the protective system malfunctioned and did not operate as expected.

FIG. 5 shows a process flow diagram illustrating an example method 400 for self-testing a neutral blocking protective system, using the first test circuit 240 described above. Specifically, method 400 recites a method for testing the circuit breaker arrangement. First the self-test controller (e.g., controller 104 of FIG. 1) closes the associated electronically activated switch, at step 402. Once the electronically activated switch is closed a test signal is injected through the shunt resistor, at step 404. The self-test controller checks if the circuit breakers open in response to the test signal applied on the shunt resistor, at step 406. Next, the self-test controller will record and send an alarm to the substation operator if the circuit breakers do not open in response to the test signal, at step 408.

Figure 6A:
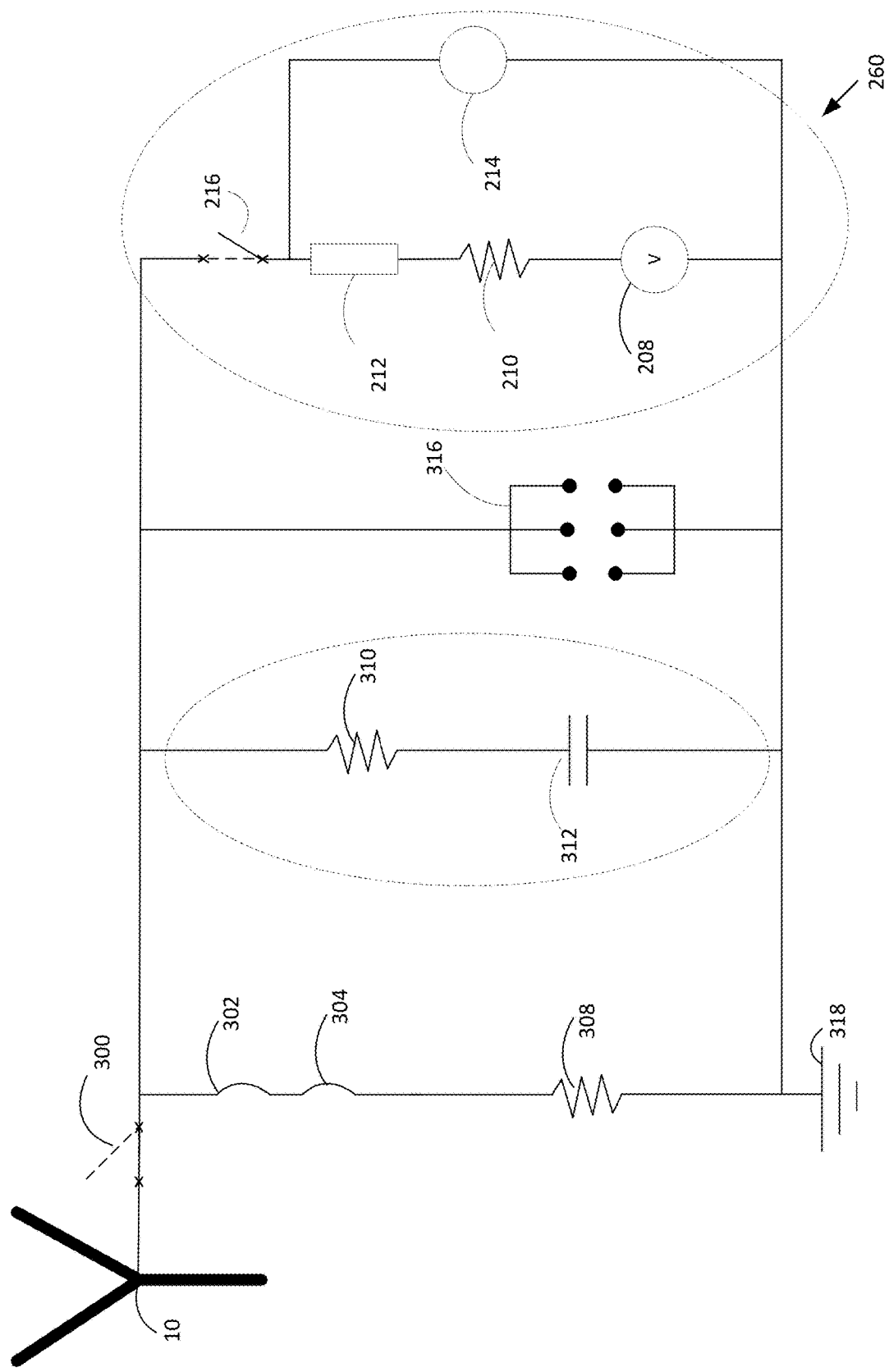
FIG. 6A is a circuit diagram that shows the testing circuit of the capacitor bank in a neutral blocking protection system.

FIG. 6A shows details of the second self-testing circuit 260, for testing the capacitor bank of an HV or EHV transformer protection system. In normal, non-testing, operation the electronic switch 216 is in the open position, as shown in FIG. 6A, and there is no self-test current connected to the protective grounding system.

Figure 6B:
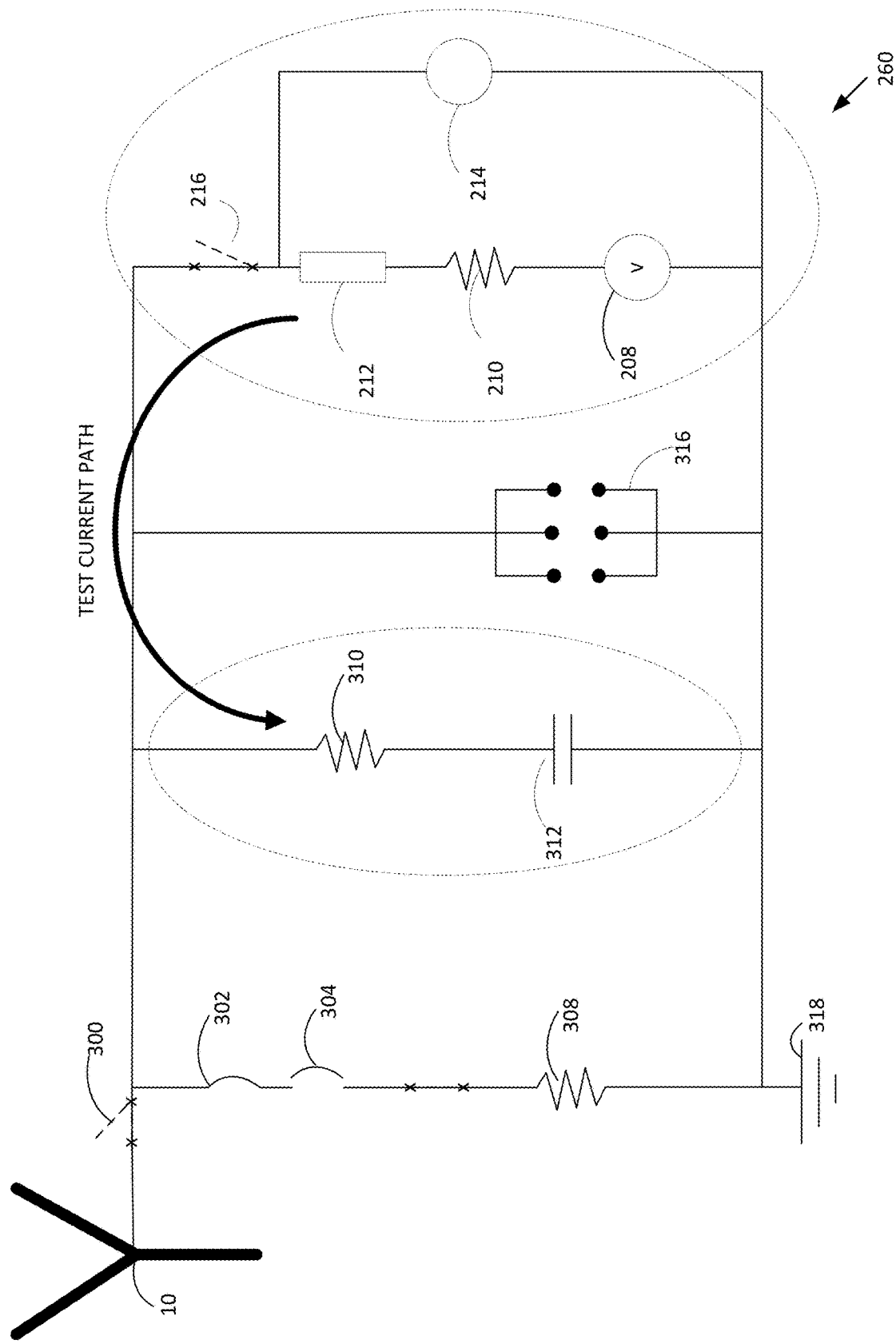
FIG. 6B is a circuit diagram that shows the testing mode of a capacitor bank in a neutral blocking protection system in its testing mode.

In one embodiment, a programmed controller initiates a test by closing the electronic switch 216 (e.g., controller 104 of FIG. 1), as seen in FIG. 6B. Closing electronic switch 216 initiates the injection of an AC test current signal onto the damping resistor 310 and capacitor bank 312, which allows a measurement of the impedance of the capacitor bank 312 and damping resistor 310. It should be noted that the spark gap assembly 316 will represent an open circuit; that is, the capacitance of the spark gap assembly 316 will essentially be negligible as compared to the capacitance of the capacitor bank. However, the inductance and resistance of the combination HV or EHV transformer and power line will contribute a parallel current path when this test voltage is applied to the transformer neutral 10 connection of the transformer 12 i.e. the connection to the GIC blocking capacitor 312 and series damping resistor 310. To overcome this issue a self-testing source with a frequency which is significantly larger than the power system frequency (50 or 60 Hz) can be selected such that the resultant test current in the combined capacitor bank 312 and series damping resistor 310 is much larger than the test current flowing into the HV transformer windings and in the power lines to the downstream transmission system. By this means the self-testing current will be primarily that which flows through the capacitor bank 312 and series resistor 310 such that an accurate measure of the DC blocking capacitor bank 312 and series resistor 310 can be measured and verified that it is still within the limits of the original design value. Furthermore, during the installation of the GIC blocking system a calibration process could be used to measure the expected test current at this higher testing frequency when the system is connected to the transformer neutral 10. This will then allow the self-testing of the capacitor bank to result in accurate measurements from the current measurement component 212 and the voltage measurement component 214.

The selection for the frequency of the self-testing of the capacitor bank 312 is aimed at enhancing the applied self-test current thru the capacitor bank 312 as compared to the current that flows through the HV transformer and power line. This approach will allow for the sensitivity of the self-test to be more dependent on any changes in the capacitor bank 312 and series resistor 310 than changes in the HV transformer and power line. So for example by selecting a frequency voltage source for the self-test frequency which is significantly larger than 60 Hz, (i.e. one might select a frequency of 200 Hz or more but not a multiple of the AC power frequency) the capacitor bank 312 will have a smaller impedance ($1/\omega C$) and therefore the self-test current through the capacitor bank 312 will be enhanced. Likewise, a self-test frequency which is larger than 60 Hz will also result in a larger HV transformer impedance ($\omega L$) and therefore a smaller current through the HV transformer and power line. The resultant total self-test current will then be more sensitive to changes in the capacitor bank and series resistor.

Additionally, by measuring both real and imaginary components of the combined damping resistor 310 and capacitor bank 312 the impedance of the damping resistor 310 and capacitor bank 312 can be determined. These components may be measured from the current measurement component 212 and the voltage measurement component 214. From these measurements both the capacitance and damping resistance of this series combination can be verified. Should the capacitance or the damping resistance values be substantially different than the nominal design values of these two elements, a message of non-compliance will be sent to the sub-station operator indicating that these values are no longer acceptable and an onsite inspection and maintenance should be ordered for this protection system.

FIG. 6B shows the circuit of FIG. 6A used in a second testing method for the capacitor bank 312. A programmed controller (e.g., controller 104 of FIG. 1) optionally sends a command to an automated motorized grounding switch 300 to disconnect the electrical protective circuit from the transformer neutral 10 connection of the transformer 12. Note a motorized grounding switch ensures that the transformer 12 will generally be connected either directly to an electrical ground or to the multiple grounding paths provided by protective grounding system (the neutral blocking system) described in this patent description and associated figures. By disconnecting the protective grounding system from the transformer, the primary components in protective grounding system can be automatically tested without interference from the HV or EHV transformer or other components of the power system.

In addition, the controller will (1) close the electronic switch 216, as noted above, and (2) open the DC breaker 304 and/or AC Breaker 302 in the breaker assembly before the testing of the capacitor bank can be achieved. The closing of electronic switch 216 starts the injection of an AC or in some cases a DC test current signal into the damping resistor 310 and capacitor bank 312 which allows a measurement of the impedance of the capacitor bank 312 and damping resistor 310 using the current measurement component 214 and the voltage measurement component 214. It should be noted that the spark gap assembly 316 will represent an open circuit; that is, the capacitance of the spark gap assembly 316 will essentially be negligible as compared to the capacitance of the capacitor bank 312. By this means the self-testing current that flows through the capacitor bank and the series resistor can be used to accurately measure capacitance of the DC blocking capacitor bank 312 to verify that it is still within the limits of the original design value. This will then allow the self-testing of the capacitor bank 312 and the series damping resistor 310 to verify their values are within the original specifications of the neutral blocking system.

Should the capacitance or the damping resistance values be substantially different than the nominal design values of these two elements, a message of non-compliance will be sent to a sub-station operator indicating that these values are no longer acceptable and an onsite inspection and maintenance should be ordered for this protection system.

Note there are several measurement methods that could be used to determine if the capacitor bank 312 and or the damping resistor 310 are within an acceptable range as compared to the original design specification. In a first capacitance testing example one could apply the test AC voltage as shown in FIG. 6A to determine the magnitude of the resultant AC test current. If this resultant test current is within an acceptable range, then the capacitor bank 312 can be determined to be acceptable. However, if the resultant test current is outside the acceptable range an error message can be sent to a sub-station operator. It should also be noted that a measurement of both the resultant test current and its phase angle with respect to the applied AC voltage test signal could be used to determine both the value of the damping resistor 310 as well as the capacitance of the capacitor bank 312. This would allow an operator to be able to determine if the damping resistor or the capacitor bank or both were degraded as compared to the original specifications for these two components.

Figure 7:
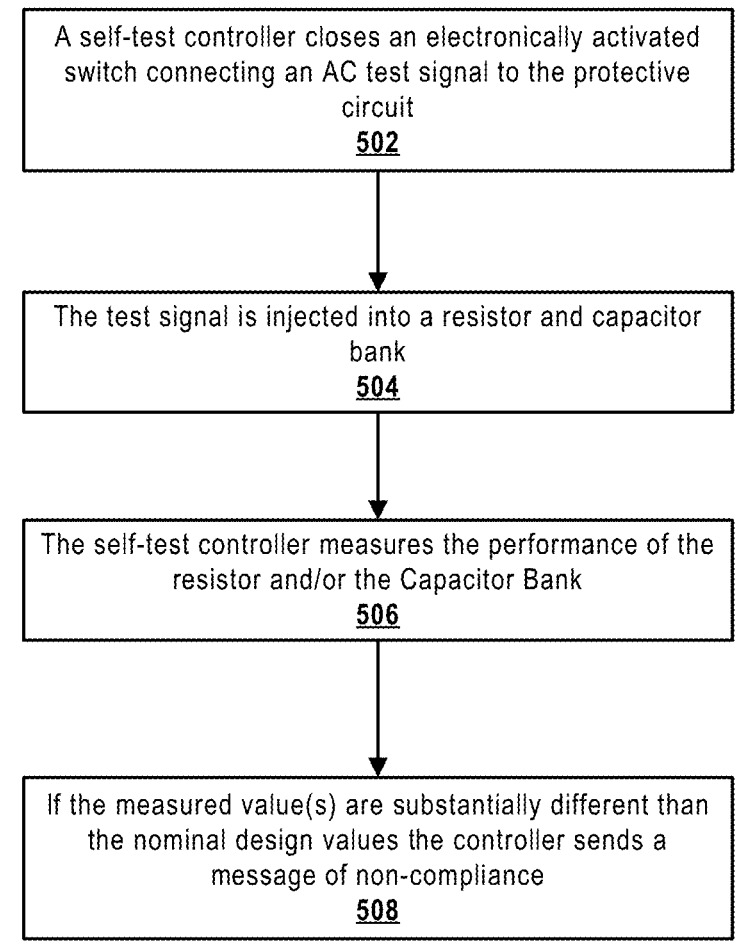
FIG. 7 is a process flow diagram illustrating an example method for self-testing a capacitor bank in a neutral blocking protection system.

FIG. 7 shows a process flow diagram illustrating an example method 500 for self-testing a damping resistor and a capacitor bank in a protective grounding system. First, the self-test controller closes the electronically activated switch connected to the test signal, at step 502. As discussed above, and shown in FIG. 6A, the test signal may be a high frequency stimulus which is significantly larger than the power system frequency (50 or 60 Hz). Next, this test stimulus is injected into the resistor and capacitor bank, at step 504. Then the self-test controller will measure the performance of the damping resistor and/or the capacitor bank, at step 506. There are many methods for testing the damping resistor and the capacitor bank individually or coupled which are discussed above. Finally, if the measure values are substantially different than the nominal design values for the components the controller will send a message of non-compliance to the sub-station operator indicating that these values are no longer acceptable and an onsite inspection and maintenance should be ordered for this protection system at step 508.

Figure 8:
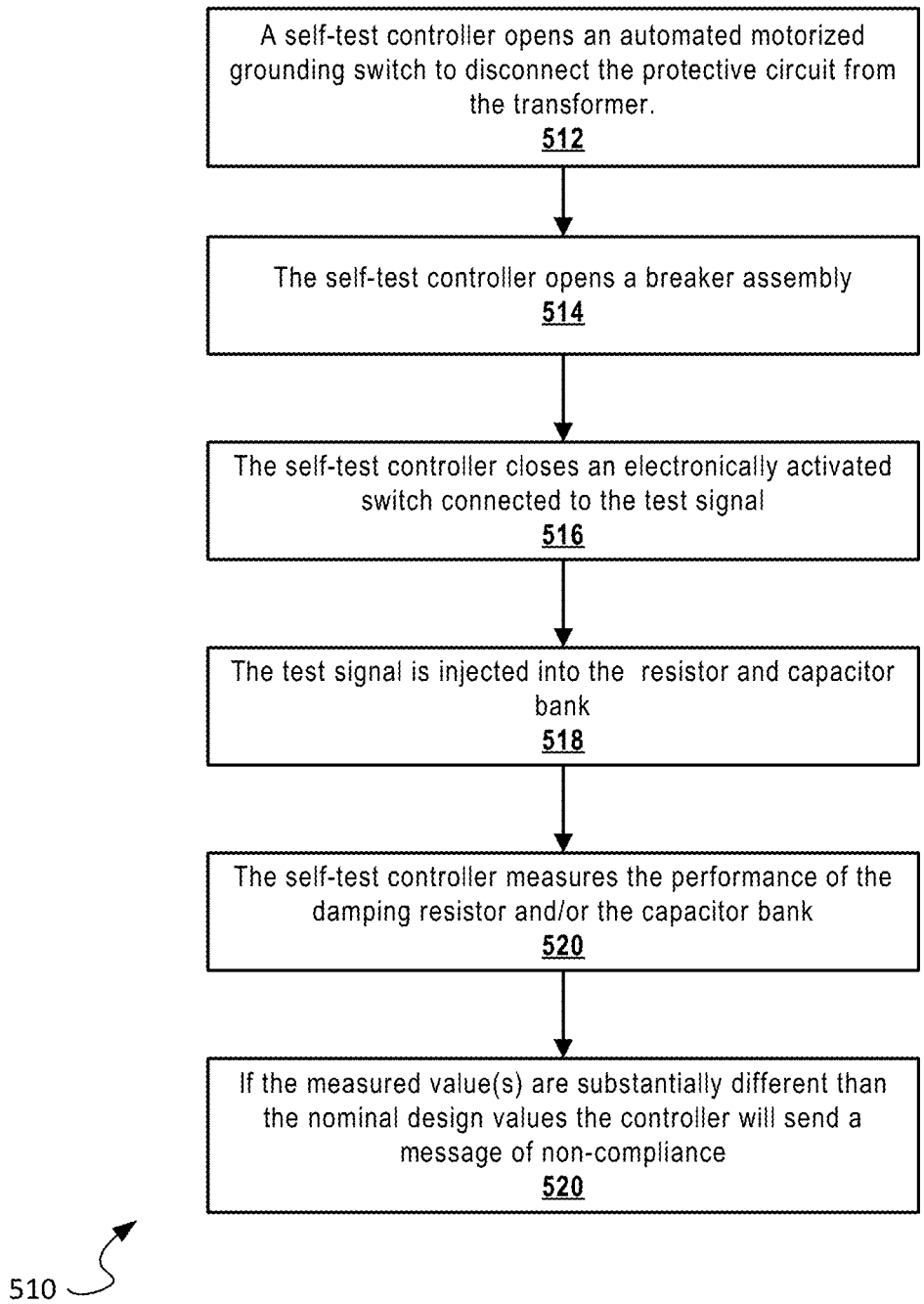
FIG. 8 is a process flow diagram illustrating an example method for self-testing a damping resistor in a resistor-capacitor network used in a neutral blocking protection system.

FIG. 8 shows a process flow diagram illustrating another example method 510 for self-testing a damping resistor and a capacitor bank in a protective grounding system. First, the self-test controller will open the automated motorized grounding switch to disconnect the electrical protective circuit from the connection of the HV or EHV transformer, at step 512. Next, the self-test controller will open a breaker in the breaker assembly, at step 514. To initiate the test stimulus the self-test controller will close the electronically activated switch connected to the test circuit at step 516. The test signal is then injected into the resistor and capacitor bank at step 518. As discussed above the test signal may come from an AC or DC voltage source or from a current source. Then the self-test controller will measure the performance of the damping resistor and/or the capacitor bank at step 520. There are many methods for testing the damping resistor and the capacitor bank individually or coupled which are discussed above. Finally, if the measure values are substantially different than the nominal design values for the components the controller will send a message of non-compliance to the sub-station operator indicating that these values are no longer acceptable and an onsite inspection and maintenance should be ordered for this protection system at step 522.

Figure 9A:
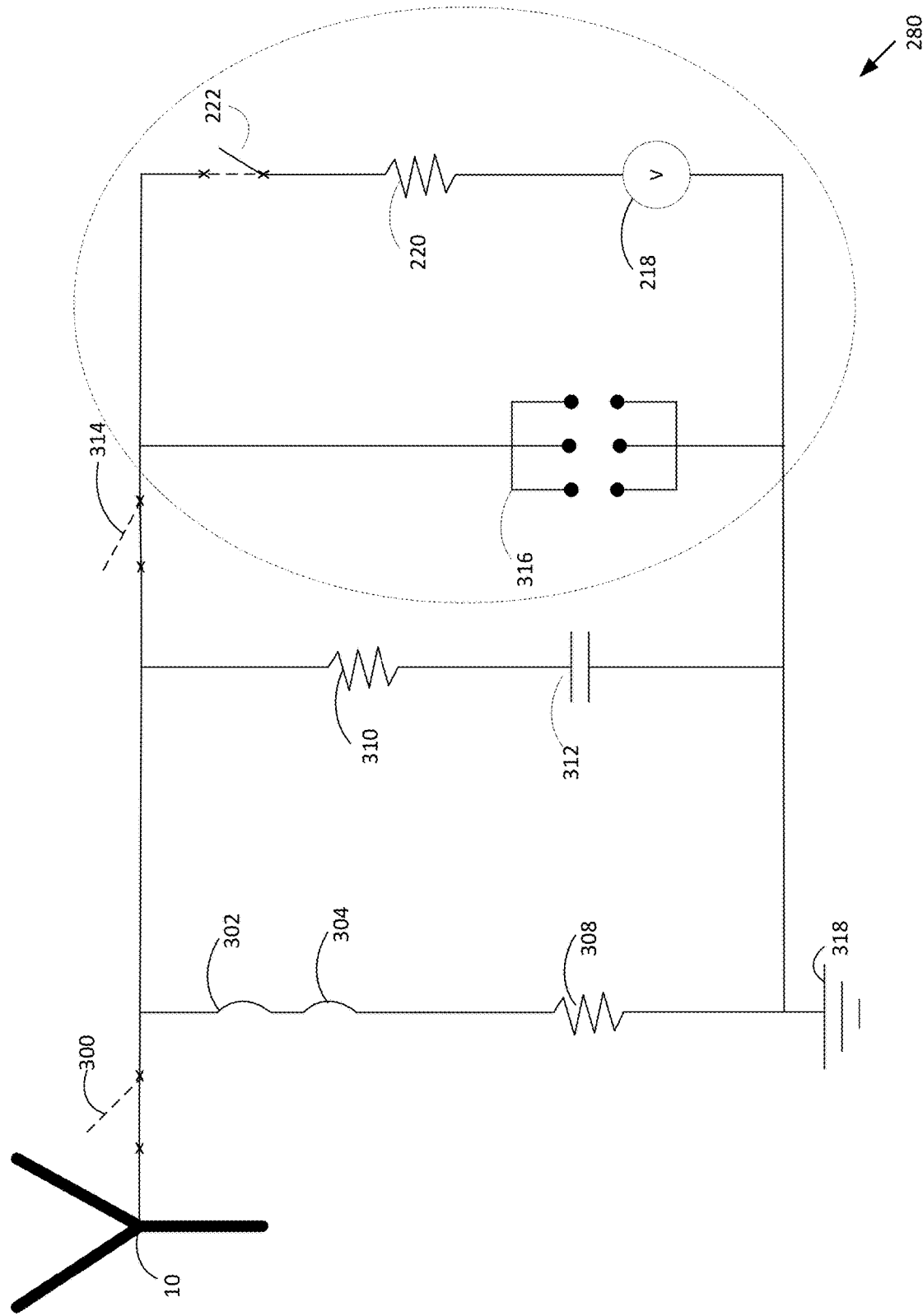
FIG. 9A is circuit diagram that shows the testing circuit of a spark gap assembly of a neutral blocking protection system.

FIG. 9A is a generalized embodiment of a third self-testing circuit, set in a normal mode, that periodically injects a high voltage signal into a protective spark gap assembly 316 to create an arc in the gap of one or more of the spark gaps in order to verify that the spark gap assembly 316 is still operating as expected and initiates an arc in the gap of one or more of the spark gaps at the designated preset voltage value. This self-test will then ensure that the protective spark gap assembly 316 is in working order, even after experiencing many months in various weather conditions, and continues to be a reliable protection device for protecting an HV or EHV transformer from an unexpected ground fault. In normal operation electronic switch 222 is open, as shown in FIG. 9A, disconnected the test circuit from the protective grounding system. Additionally, electronic switch 314 is closed, and/or the automated motorized grounding switch 300 is closed, as shown in FIG. 9A, connecting the transformer neutral 10 of the transformer 12 to the protective grounding system.

Figure 9B:
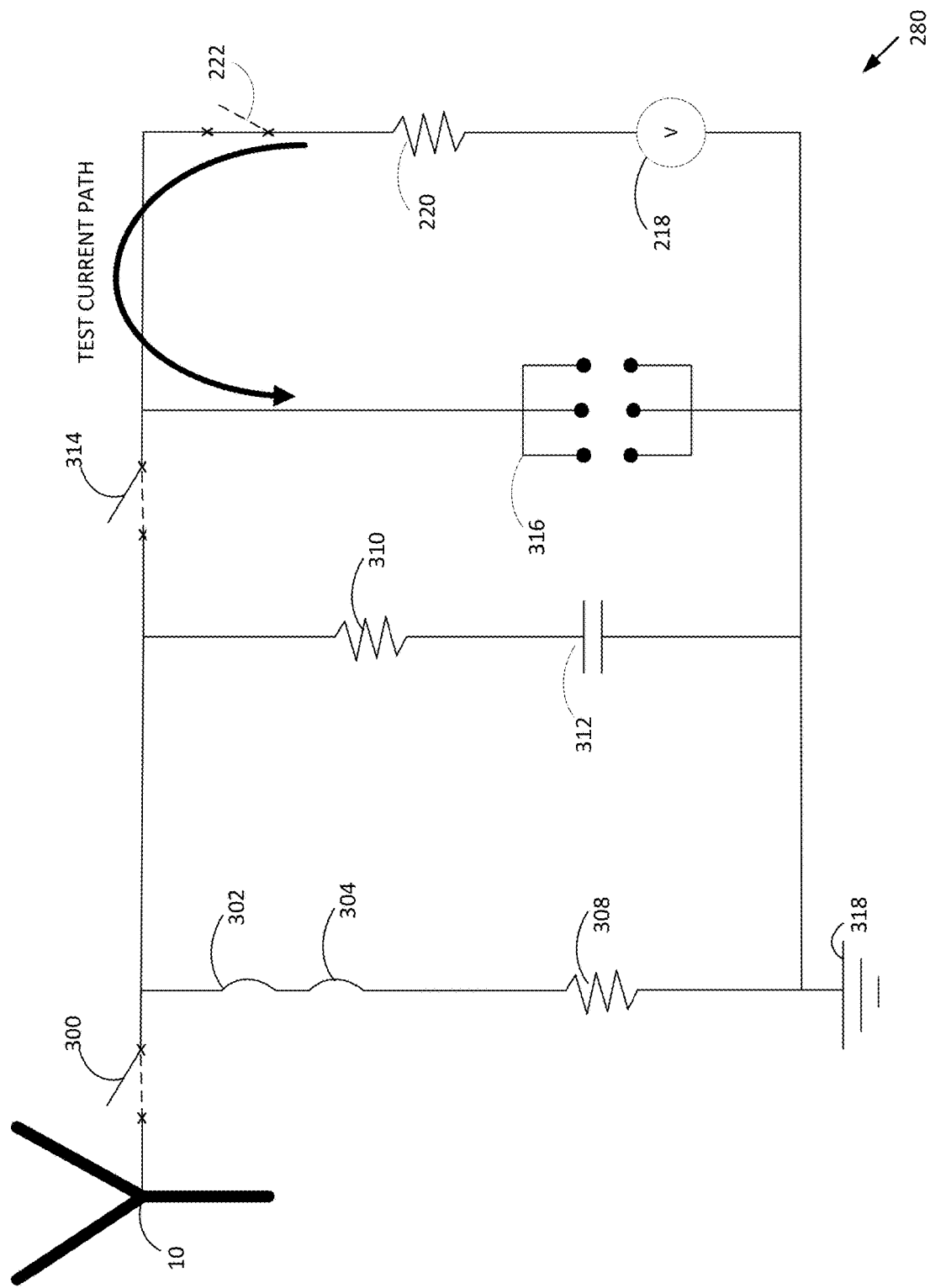
FIG. 9B is circuit diagram that shows the testing circuit of a spark gap assembly of a neutral blocking protection system in its testing mode.

FIG. 9B also shows the third self-testing module, set in a testing mode, connected to a neutral ground blocking system which is used to test and verify that the ground fault protective spark gap assembly 316 has not deteriorated, either by weather or other cause, and can continue to be relied on to protect the HV or EHV transformer 100 should an unexpected ground fault occur. Before this test is initiated the protective ground blocking system can be disconnected by automatically operating the motorized disconnect switch 300 from the transformer neutral 10 of the transformer 12, so that a high voltage testing source, sometimes 20 kV, can be applied to the protection system. Additionally, the breaker assembly, for example, the DC breaker 304, will automatically be placed in its open position. In some embodiments, the Protective Grounding system may include an electronic switch 314, which is opened by the controller and allows for a high voltage testing source, sometimes 20 kV, to be applied over the spark gap assembly 316, as shown in FIG. 9B, instead of operating the motorized disconnect switch 300 and opening the DC breaker 304. Other embodiments with arrangements which allow a high voltage across the spark gap also exist and are included in the present disclosure.

To achieve this test a voltage source 218 connected directly across the spark gap assembly 316 to initiate a test arc current in the spark gap to verify the arc over voltage is within an acceptable range. In some embodiments the voltage source 218 for this test will need to be a calibrated to ensure that the voltage does not exceed the voltage limit of the capacitor bank 312 but still high enough to initiate a test arc in the spark gap assembly 316. The third circuit shown in FIG. 2, and discussed above, generates the voltage and current for initiated an arc in the spark gap assembly 316. The maximum voltage on the spark gaps is then measured and registered in the test electronics or controller processor which would usually be housed in the substation control building. It should be noted that either an AC or DC test current could be used for this testing of the characteristics of the spark gaps.

Note the typical component, test voltages and current values could be either smaller or larger than those referenced above. Also note that this test could include the testing of multiple spark gaps if each spark gap electrode pairs are separately disconnected from the other pairs and the capacitor bank 312. Additionally, this spark gap testing could be configured if necessary, to include either manual or electronically controlled switches placed between the multiple spark gaps which are not shown in FIG. 9A-9B.

Figure 10:
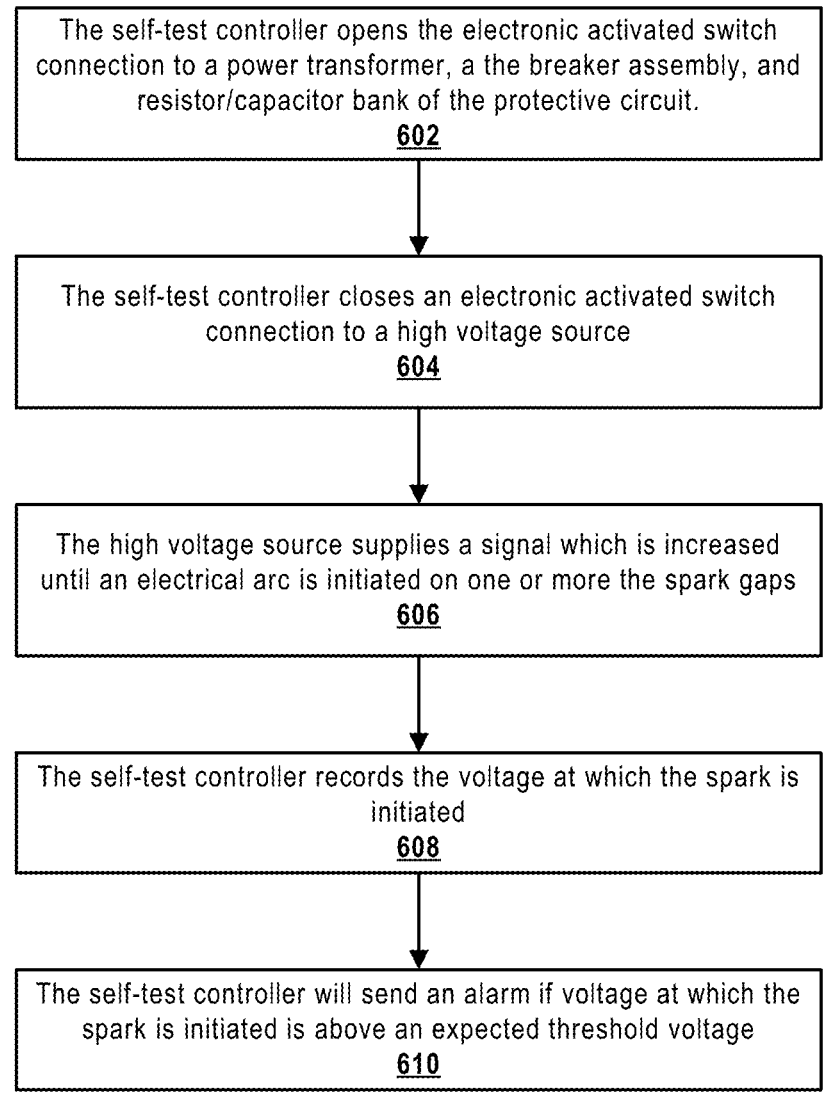
FIG. 10 is a process flow diagram illustrating an example method for self-testing a spark gap assembly of a neutral blocking protection system.

FIG. 10 shows a process flow diagram illustrating an example method 600 for self-testing a spark gap assembly in a protective grounding system. First, the self-test controller will open the automated motorized grounding switch to disconnect the electrical protective circuit from the connection of the HV or EHV transformer and open a breaker in the breaker assembly at step 602. The controller will close the electronic activated switch connection to a high voltage source at step 604. The voltage across the spark gaps will increase until an electrical arc is initiated on at least one of the spark gaps at step 606. The controller will record the voltage across the spark gap assembly where a spark is initiated at step 608. Finally, if the spark is initiated at a voltage above an expected voltage threshold the controller will send a message of non-compliance to the sub-station operator indicating that the voltage at which a spark is initiated is no longer acceptable at step 610.

Figure 11:
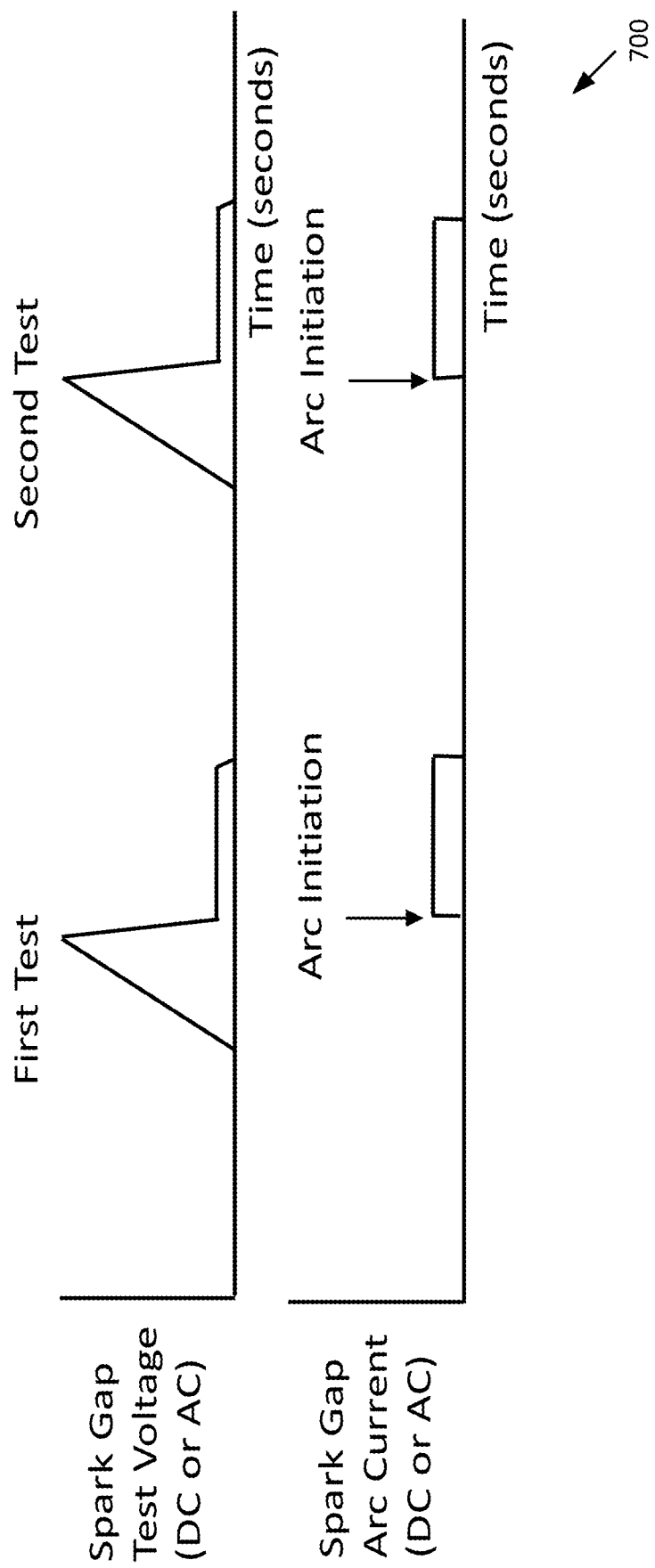
FIG. 11 is an example graphs of multiple spark gap self-tests.

FIG. 11 shows an example graph 700 of multiple spark gap self-tests. The example graph represents the voltage clipping effect of the spark gap assembly at a threshold. The AC or DC voltage across the spark gap increases until an arc is initiated across the spark gap, as shown on the top graph. The arc is initiated at a break down voltage which will limit the voltage across the spark gap assembly and protect other components in the protective grounding system. Once an arc is imated an arc current passes through the spark gap assembly, as shown in the bottom graph. The separation in the spark gap allows for the arc current to dissipate large amounts of energy. Further example operations of such a spark gap are described in U.S. Pat. No. 9,660,441, which was previously incorporated by reference, above.

While particular uses of the technology have been illustrated and discussed above, the disclosed technology can be used with a variety of data structures and processes in accordance with many examples of the technology. The above discussion is not meant to suggest that the disclosed technology is only suitable for implementation with the data structures shown and described above. For examples, while certain technologies described herein were primarily described in the context of queueing structures, technologies disclosed herein are applicable to data structures generally.

This disclosure described some aspects of the present technology with reference to the accompanying drawings, in which only some of the possible aspects were shown. Other aspects can, however, be embodied in many different forms and should not be construed as limited to the aspects set forth herein. Rather, these aspects were provided so that this disclosure was thorough and complete and fully conveyed the scope of the possible aspects to those skilled in the art.

As should be appreciated, the various aspects (e.g., operations, memory arrangements, etc.) described with respect to the figures herein are not intended to limit the technology to the particular aspects described. Accordingly, additional configurations can be used to practice the technology herein and/or some aspects described can be excluded without departing from the methods and systems disclosed herein.

Similarly, where operations of a process are disclosed, those operations are described for purposes of illustrating the present technology and are not intended to limit the disclosure to a particular sequence of operations. For example, the operations can be performed in differing order, two or more operations can be performed concurrently, additional operations can be performed, and disclosed operations can be excluded without departing from the present disclosure. Further, each operation can be accomplished via one or more sub-operations. The disclosed processes can be repeated.

Although specific aspects were described herein, the scope of the technology is not limited to those specific aspects. One skilled in the art will recognize other aspects or improvements that are within the scope of the present technology. Therefore, the specific structure, acts, or media are disclosed only as illustrative aspects. The scope of the technology is defined by the following claims and any equivalents therein.

The invention claimed is:

1. A self-testing system for use within an electrical protection circuit comprising:
   the electrical protection circuit electrically connected between a neutral of a transformer and a ground, the transformer electrically connected to a power grid, wherein the electrical protection circuit includes a switch assembly;
   wherein the switch assembly includes a plurality of switches connected in series with a shunt resistor between the neutral and the ground, the shunt resistor being electrically connected adjacent the ground;
   a switch assembly test circuit comprising:
      a switch-testing voltage source in series with a current limiting resistor;
      a test actuation switch electrically connected between the switch-testing voltage source, and a location between the shunt resistor and the switch assembly, wherein, when the test actuation switch is closed, a test current is applied across the shunt resistor to test whether the switch assembly is actuated in response to a detected current flowing through the shunt resistor exceeding a predetermined threshold, the detected current being representative of potential damage to one of the transformer or a DC blocking circuit.

2. The self-testing system of claim 1, wherein:
   the electrical protection circuit further includes the DC blocking component connected in parallel with the switch assembly between the neutral and the ground;
   a source electrically connected in parallel with the DC blocking component, the source including a voltage source, a current measurement device configured to determine a current flowing through the DC blocking component, and a voltage measurement device configured to determine a voltage across the DC blocking component; and
   an additional test actuation switch electrically connected between the source and the DC blocking component, wherein, when the additional test actuation switch is closed, a test voltage is applied across the DC blocking component, and an impedance of the DC blocking component is measured and compared to an expected design value.

3. The self-testing system of claim 1, wherein:
   the electrical protection circuit further includes a spark gap assembly electrically connected in parallel with the assembly between the neutral and the ground;

a transformer protection switch electrically connected between the transformer neutral and the electrical protection circuit;

a high voltage source electrically connected in parallel with the spark gap assembly;

an additional test actuation switch electrically connected between the high voltage source and the spark gap assembly, wherein, when the additional test actuation switch is closed, a test high voltage is injected across the spark gap assembly to determine a breakdown voltage of the spark gap assembly.

4. A self-testing system for use within an electrical protection circuit comprising:

the electrical protection circuit electrically connected between a neutral of a transformer and a ground, the transformer electrically connected to a power grid, wherein the electrical protection circuit includes a DC blocking component;

a test voltage source electrically connected in parallel with the DC blocking component, the test voltage source including a voltage source, a current measurement device configured to determine a current flowing through the DC blocking component, and a voltage measurement device configured to determine a voltage across the DC blocking component; and a switch electrically connected between the test voltage source and the DC blocking component;

wherein the self-test system has a testing mode in which the first switch is opened and the switch is closed to introduce a test voltage across the DC blocking component, and wherein an impedance of the DC blocking component is measured and compared to an expected design value in the testing mode.

5. The self-testing system of claim 4, wherein:
the electrical protection circuit further includes:
a spark gap assembly electrically connected in parallel with the DC blocking component between the neutral and the ground; and
a second switch electrically connected between the transformer neutral and the DC blocking component,
wherein the self-testing system further includes:
  a high voltage source;
  a third switch, wherein the high voltage source and the third switch are electrically connected in series with each other and in parallel with the spark gap assembly;
wherein, when the third switch is closed and the second switch is opened, a test high voltage is injected across the spark gap assembly to determine a breakdown voltage of the spark gap assembly.

6. The self-testing system of claim 5, wherein the high voltage source is configured to increase the test high voltage from a predetermined level until an electrical arc is initiated across the spark gap assembly;
wherein the voltage at which the electrical arc is initiated is compared to an expected threshold voltage by the self-testing system.

7. The self-testing system of claim 6, wherein, when the third switch is closed to inject the test high voltage across the spark gap assembly, a fourth switch is opened to isolate the spark gap from the transformer neutral and the DC blocking component.

8. The self-testing system of claim 6, wherein the self-testing system sends an alarm if the voltage at which the electrical arc is initiated is higher than the expected threshold voltage.

9. The self-testing system of claim 6, wherein the spark gap assembly includes a plurality of spark gaps in parallel to each other.

10. The self-testing system of claim 6, wherein the high voltage source applies a voltage of greater than 5 kilovolts across the spark gap assembly.

11. The self-testing system of claim 4, wherein the second switch comprises an automated motorized grounding switch.

12. The self-testing system of claim 4, wherein the DC blocking component is electrically connected in parallel with a switch assembly, and the electrical protection circuit has a protective mode in which the switch assembly is in an open position and a normal operating mode in which the switch assembly is in a closed position.

13. The self-testing system of claim 12, wherein the switch assembly includes a plurality of switches connected in series with a shunt resistor between the neutral and the ground, the shunt resistor being electrically connected adjacent the ground.

14. The self-testing system of claim 13, further comprising:
a switch assembly test circuit comprising:
  a switch-testing voltage source;
  a test actuation switch electrically connected between the switch-testing voltage source, and a location between the shunt resistor and the switch assembly, wherein, when the test actuation switch is closed, a test current is applied across the shunt resistor to test whether the switch assembly is actuated in response to a detected current flowing through the shunt resistor exceeding a predetermined threshold representative of potential damage to one of the transformer or the DC blocking circuit.

15. The self-testing system of claim 14, wherein the predetermined threshold represents a simulated geomagnetic induced quasi-dc current (GIC) or electromagnetic pulse (EMP-E3) quasi-dc current.

16. The self-testing system of claim 15, wherein the self-testing system sends an alarm in response to failure of the switching assembly to actuate in response to the detected current.

17. The self-testing system of claim 4, wherein the DC blocking component comprises a resistor and a capacitor bank.

18. A self-testing system for use within an electrical protection circuit comprising:
the electrical protection circuit electrically connected between a neutral of a transformer and a ground, the transformer electrically connected to a power grid, wherein the electrical protection circuit includes a spark gap assembly;
a first switch electrically connected between the transformer neutral and the spark gap assembly;
a high voltage source;
a second switch, wherein the high voltage source and the second switch are electrically connected in series with each other and in parallel with the spark gap assembly;
wherein, when the second switch is closed and the first switch is opened, a test high voltage is injected across the spark gap assembly to determine a breakdown voltage of the spark gap assembly.

19. The self-testing system of claim 18, further comprising:
a switch assembly test circuit comprising:
  a switch-testing voltage source;
  a test actuation switch electrically connected between the switch-testing voltage source, and a location between the shunt resistor and the switch assembly, wherein, when the test actuation switch is closed, a test current is applied across the shunt resistor to test whether the switch assembly is actuated in response to a detected current flowing through the shunt resistor exceeding a predetermined threshold representative of potential damage to one of the transformer or the DC blocking circuit.

20. A method for testing an electrical protection circuit electrically connected to a transformer, the method comprising:
    opening an automated motorized or manual grounding switch connecting the electrical protective circuit to the transformer;
    closing a switch connecting a test circuit to a DC blocking component;
    generating a voltage across the DC blocking component;
    measuring an impedance of the DC blocking component;
    comparing the impedance measured to an expected design value of the DC blocking component.

21. The method of claim 20, further comprising;
    closing a second electronic switch connecting a second test circuit to a spark gap assembly;
    generating a high voltage across the spark gap assembly;
    determining a breakdown voltage of the spark gap assembly.

22. The method of claim 21, further comprising:
    closing a third electronic switch connecting a third test circuit to a shunt resistor;
    generating a test current to flow through the shunt resistor;
    detecting a voltage across the shunt resistor exceeding a predetermined threshold representative of potential damage to one of the transformer or the DC blocking circuit;
    opening a switch assembly in response to the detected voltage exceeding the predetermined threshold.

\* \* \* \* \*